(12) United States Patent
Oshiyama et al.

(10) Patent No.: US 7,592,075 B2
(45) Date of Patent: *Sep. 22, 2009

(54) ORGANIC ELECTROLUMINESCENCE ELEMENT

(75) Inventors: Tomohiro Oshiyama, Hachioji (JP); Hiroshi Kita, Hachioji (JP); Taketoshi Yamada, Saitama (JP)

(73) Assignee: Konica Corporation (JP)

( * ) Notice: Subject to any disclaimer, the term of this patent is extended or adjusted under 35 U.S.C. 154(b) by 309 days.

This patent is subject to a terminal disclaimer.

(21) Appl. No.: 11/516,285

(22) Filed: Sep. 6, 2006

(65) Prior Publication Data

US 2007/0015008 A1     Jan. 18, 2007

Related U.S. Application Data

(62) Division of application No. 10/410,312, filed on Apr. 9, 2003, now Pat. No. 7,128,982.

(30) Foreign Application Priority Data

Apr. 12, 2002  (JP) .............................. 2002-110303

(51) Int. Cl.
*H01L 51/54* (2006.01)
(52) U.S. Cl. ...................... 428/690; 428/212; 428/917; 313/504; 313/506; 257/E51.044
(58) Field of Classification Search ........................ None
See application file for complete search history.

(56) References Cited

U.S. PATENT DOCUMENTS 5,776,623 A     7/1998   Hung et al. .................. 428/690
7,128,982 B2 *  10/2006  Oshiyama et al. ........... 428/690

2002/0071963 A1     6/2002   Fujii .......................... 428/690
2002/0182441 A1 *  12/2002  Lamansky et al. ........... 428/690
2003/0091860 A1    5/2003   Oshiyama et al. ........... 428/690

FOREIGN PATENT DOCUMENTS

| JP | 2000-30868 | 1/2000 |
| WO | WO-00-16593 | 3/2000 |
| WO | WO-01-08230 | 2/2001 |
| WO | WO-02-41414 | 5/2002 |

OTHER PUBLICATIONS

European Search Report for European Patent Application No. EP-03-00-7431 mailed Aug. 9, 2007.

* cited by examiner

*Primary Examiner*—Marie R. Yamnitzky
(74) *Attorney, Agent, or Firm*—Cantor Colburn LLP

(57) ABSTRACT

An organic electroluminescence element is disclosed which comprises a hole transporting layer containing a hole transporting material, a light emission layer containing a host compound and a phosphorescent compound, a hole blocking layer, and an electron transporting layer, the host compound having a band gap of from 3.3 eV to 5 eV, and having a molecular weight of not less than 500, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer.

5 Claims, No Drawings

ORGANIC ELECTROLUMINESCENCE ELEMENT

CROSS REFERENCE TO RELATED APPLICATION

The present application is a divisional application of U.S. patent application Ser. No. 10/410,312, filed on Apr. 9, 2003 (now U.S. Pat. No. 7,128,982), the entire contents of which are incorporated herein by reference. The Ser. No. 10/410, 312 application claimed the benefit of the date of the earlier filed Japanese Patent Application No. JP 2002-110303 filed Apr. 12, 2002.

FIELD OF THE INVENTION

This invention relates to an organic electro-luminescence (hereinafter referred to also as organic EL) element, and particularly to an organic electroluminescence element with excellent luminance of emitted light and long lifetime.

BACKGROUND OF THE INVENTION

As an emission type electronic displaying device, there is an electroluminescence device (ELD). As materials constituting the ELD, there is an inorganic electroluminescence element or an organic electroluminescence element. The inorganic electroluminescence element has been used for a plane-shaped light source, but a high voltage alternating current has been required to drive the element. An organic electroluminescence element has a structure in which a light emission layer containing a light emission compound is arranged between a cathode and an anode, and an electron and a hole were injected into the light emission layer and recombined to form an exciton. The element emits light, utilizing light (fluorescent light or phosphorescent light) generated by deactivation of the exciton, and the element can emit light by applying a relatively low voltage of from several to several decade volts. Further, the element has a wide viewing angle and a high visuality since the element is of self light emission type, and the element is a complete solid element, and the element is noted from the viewpoint of space saving and portability.

However, in the organic EL element for practical use, an organic EL element is required which efficiently emits light with high luminance at a lower power.

In U.S. Pat. No. 3,093,796, there is disclosed an element with long lifetime emitting light with high luminance in which stilbene derivatives, distyrylarylene derivatives or tristyrylarylene derivatives are doped with a slight amount of a fluorescent compound.

An element is known which comprises an organic light emission layer containing an 8-hydroxyquinoline aluminum complex as a host compound doped with a slight amount of a fluorescent compound (Japanese Patent O.P.I. Publication No. 63-264692), and an element is known which comprises an organic light emission layer containing an 8-hydroxyquinoline aluminum complex as a host compound doped with a quinacridone type dye (Japanese Patent O.P.I. Publication No. 3-255190).

When light emitted through excited singlet state is used, the upper limit of the external quantum efficiency (next) is considered to be at most 5%, as the generation ratio of singlet excited species to triplet excited species is 1:3, that is, the generation probability of excited species capable of emitting light is 25%, and further, external light emission efficiency is 20%. Since an organic EL element, employing phosphorescence through the excited triplet, was reported by Prinston University (M. A. Baldo et al., Nature, 403, 17, p. 151-154 (1998)), study on materials emitting phosphorescence at room temperature has been actively made. As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

In order to improve luminance and emission lifetime of the organic EL element, proposal has been made in which a hole blocking layer, inhibiting migration of holes from the light emission layer, is provided between the light emission layer and the cathode. This hole blocking layer can efficiently accumulate holes in the light emission layer and improve a recombination probability of electrons and holes, resulting in light emission with high efficiency. It is reported, for example, in Japanese Patent O.P.I. Publication Nos. 8-109373 and 10-233284, that a phenanthroline derivative and a triazole derivative are effectively used alone as a hole blocking material of the hole blocking layer. In Japanese Patent O.P.I. Publication No. 2001-28405 is disclosed an organic El element with long lifetime in which a specific aluminum complex is used in the hole blocking layer. It has been reported (for example, in Twelfth OyobutsuriGakkai Gakujutsukoen Kai Yokoshu 12-a-M7 or in Pioneer Gijutsu Johoshi, Vol. 11, No. 1) that a red or green light emission organic EL element employing a phosphorescent compound, when a hole blocking layer is incorporated in it, exhibits an inner quantum efficiency of approximately 100% and a lifetime of twenty thousand hours. However, there is room to be improved as for emission luminance.

There is an example in which a phosphorescent compound emitting a blue to blue-green color light is used as a dopant compound and a carbazole derivative such as CBP is used as a host compound, but the external qauntum efficiency of this example is around 6%, which provides unsatisfactory results, although the phosphorescent compound is used (for example, Twelfth OyobutsuriGakkai Gakujutsukoen Kai Yokoshu 12-a-M8, or Adachi et. al., "App. Phys. Lett., Vol. 79, p. 2082).

SUMMARY OF THE INVENTION

The present invention has been made in view of the aforementioned. An object of the present invention is to provide an organic electroluminescence element with excellent emission luminance and long lifetime.

DETAILED DESCRIPTION OF THE INVENTION

The object of the invention has been attained by the following constitutions:

1-1. An organic electroluminescence element comprising a hole transporting layer containing a hole transporting material, a light emission layer containing a host compound and a phosphorescent compound, a hole blocking layer, and an electron transporting layer, the host compound having a band gap of from 3.3 eV to 5.0 eV, and having a molecular weight of not less than 500, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer.

1-2. The organic electroluminescence element of item 1-1 above, wherein the hole transporting material has a ratio N/C of a nitrogen atom number N to carbon atom number C of from 0.05 to 0.10.

1-3. The organic electroluminescence element of item 1-1 above, wherein relationship $0.0 < c/d < 0.4$ is satisfied.

1-4. The organic electroluminescence element of item 1-1 above, in which relationship a>b is satisfied, wherein a (eV) represents a difference between energy level of LUMO in the light emission layer and energy level of LUMO in the hole transporting layer and b (eV) represents a difference between energy level of HOMO in the light emission layer and energy level of HOMO in the hole-transporting layer.

1-5. The organic electroluminescence element of item 1-4 above, wherein relationship $a \geq b+0.2$ is satisfied.

1-6. The organic electroluminescence element of item 1-1 above, wherein the phosphorescent compound is an iridium complex, an osmium complex or a platinum complex.

1-7. The organic electroluminescence element of item 1-6 above, wherein the phosphorescent compound is an iridium complex.

1-8. The organic electroluminescence element of item 1-6 above, wherein the phosphorescent compound is an osmium complex or a platinum complex.

1-9. An organic electroluminescence element comprising a hole transporting layer containing a hole transporting material, a light emission layer containing a host compound and a phosphorescent compound, a hole blocking layer, and an electron transporting layer, the hole transporting material having a ratio N/C of a nitrogen atom number N to a carbon atom number C of from 0.05 to 0.10, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer.

1-10. The organic electroluminescence element of item 1-9 above, wherein relationship $0.0 < c/d < 0.4$ is satisfied.

1-11. The organic electroluminescence element of item 1-9 above, in which relationship a>b is satisfied, wherein a (eV) represents a difference between energy level of LUMO in the light emission layer and energy level of LUMO in the hole transporting layer and b (eV) represents a difference between energy level of HOMO in the light emission layer and energy level of HOMO in the hole transporting layer.

1-12. The organic electroluminescence element of item 1-11 above, wherein relationship a>b+0.2 is satisfied.

1-13. The organic electroluminescence element of item 1-9 above, wherein the phosphorescent compound is an iridium complex, an osmium complex or a platinum complex.

1-14. The organic electroluminescence element of item 1-13 above, wherein the phosphorescent compound is an iridium complex.

1-15. The organic electroluminescence element of item 1-13 above, wherein the phosphorescent compound is an osmium complex or a platinum complex.

2-1. An organic electroluminescence element comprising a hole transporting layer, a light emission layer containing a host compound and a phosphorescent compound, a hole blocking layer, and an electron transporting layer, the host compound having a band gap of from 3.3 eV to 5.0 eV, and having a molecular weight of not less than 500, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer.

2-2. An organic electroluminescence element comprising a hole transporting layer, a light emission layer containing a host compound and a phosphorescent compound, a hole blocking layer, and an electron transporting layer, a hole transporting material having a ratio N/C of a nitrogen atom number N to carbon atom number C of from 0.05 to 0.10, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer.

2-3. The organic electroluminescence element of item 2-1 or 2-2 above, wherein relationship $0.0 < c/d < 0.4$ is further satisfied.

2-4. The organic electroluminescence element of any one of items 2-1 through 2-3 above comprising a hole transporting layer, a light emission layer containing a host compound and a phosphorescent compound, a hole blocking layer, and an electron transporting layer, relationship a>b being satisfied, wherein a (eV) represents a difference between energy level of LUMO in the light emission layer and energy level of LUMO in the hole transporting layer and b (eV) represents a difference between energy level of HOMO in the light emission layer and energy level of HOMO in the hole transporting layer.

2-5. The organic electroluminescence element of item 2-4 above, wherein relationship a>b+0.2 is further satisfied.

2-6. The organic electroluminescence element of any one of items 2-1 through 2-5 above, wherein the phosphorescent compound is an iridium complex.

2-7. The organic electroluminescence element of any one of items 2-1 through 2-5 above, wherein the phosphorescent compound is an osmium complex or a platinum complex.

The present invention will be detailed below.

In the invention, the phosphorescent compound is a compound in which light is emitted through light-excited triplet state in which two electron spins are in parallel with each other. Herein, the phosphorescent compound in the invention is considered to form exited triplet state at room temperature (from 15 to 30° C.) through energy transfer from the exited singlet state or excited triplet state of the fluorescent compound described above. Phosphorescent compounds have been considered to be capable of emitting phosoresce only at a low temperature such as 77K. However, since in recent years, compounds capable of emitting phosphoresce at room temperature have been found, many compounds, for example,-heavy metal-containing complexes such as iridium complexes, have been mainly synthesized and studied (see for example, S. Lamansky et al, J. Am. Chem. Soc., 123, pp. 4304, 2001).

An aluminum complex having 5 ligands, which has been recently noted, is used in a hole transporting layer, and markedly improves emission lifetime of an organic EL element as compared with bathocuproine, but has problem which lowers emission luminance. When in an organic EL element comprising organic compounds with a wide band gap, the band gap of each of the compounds constituting the element is not optimized, unless a phosphorescent compound is used in a large amount as compared with a host compound, its effect is not sufficiently exhibited.

In view of the above, the present inventors have made an extensive study on an organic EL element, and as a result, they have obtained desirable result that optimization of the energy band structure of an organic EL element forms a structure sufficiently accumulating holes and electrons at their recombination regions and provides high emission luminance and long emission lifetime.

The present invention will be explained in detail below.

Band gap referred to in the invention is a difference between ionization potential and electron affinity of a compound. The ionization potential and electron affinity are determined based on a vacuum level. The ionization potential is defined by energy necessary to release electrons of a compound existing in a HOMO (highest occupied molecular orbital) level to a vacuum level, while the electron affinity is defined by energy released when electrons of a compound existing in a vacuum level fall to a LUMO (lowest unoccupied molecular orbital) level and are stabilized.

In the invention, the band gap is obtained by vacuum depositing an organic compound on a glass plate to obtain a deposit layer with a thickness of 100 nm, measuring absorption spectra of the deposit layer, and determining wavelength Y (nm) at the longer absorption edge in the absorption spectra in terms of X (eV), where the following formula is used.

$$X = 1239.8/Y$$

The ionization potential is directly measured employing a photoelectron spectroscopy, or can be also determined by correcting oxidation potential electrochemically measured to a standard electrode.

In the invention, the ionization potential of an organic compound is directly measured employing a photoelectron spectroscopy, and is defined by a value obtained by being measured employing a low energy electron spectrometer Model AC-1 manufactured by Riken Keiki Co., Ltd.

The electron affinity is determined according to the following definition-formula of the band gap:

(Band gap)=(ionization potential)−(electron affinity)

In the invention, energy level of HOMO is the same as ionization potential, and energy level of LUMO is the same as electron affinity.

The organic EL element of the invention is characterized in that it comprises a hole transporting layer, a light emission layer containing a host compound and a phosphorescent compound, a hole blocking layer, and an electron transporting layer, the host compound having a band gap of from 3.3 eV to 5.0 eV, and having a molecular weight of not less than 500, and relationship c<d being satisfied, wherein c (eV) represents a difference between energy level of LUMO in the hole blocking layer and energy level of LUMO in the light emission layer and d (eV) represents a difference between energy level of HOMO in the hole blocking layer and energy level of HOMO in the light emission layer. The molecular weight of the host compound is preferably not less than 600, and more preferably from 600 to 2000.

Herein, "c" and "d" are represented by the following formulae:

c=(energy level of LUMO in the hole blocking layer)
−(energy level of LUMO in the light emission layer)

d=(energy level of HOMO in the hole blocking layer)
−(energy level of HOMO in the light emission layer)

In the organic EL element having the energy band structure described above, the hole blocking function of the element is sufficiently performed, which contributes to improvement of emission efficiency. Particularly, the wide band gap of the host compound contributes to improvement of emission efficiency of blue light which is a light with a shorter wavelength. Further, the host compound with a molecular weight of not less than 500, and preferably not less than 600 increases heat resistance of the organic EL element and markedly increases lifetime of the organic EL element.

In the invention, the organic EL element is characterized in that it comprises a hole transporting layer containing a hole transporting material, a light emission layer containing a host compound and a phosphorescent compound, a hole blocking layer, and an electron transporting layer, a hole transporting material having a ratio N/C of a nitrogen atom number N to carbon atom number C of from 0.05 to 0.10, and relationship c<d being satisfied, wherein c (eV) represents a difference between energy level of LUMO in the hole blocking layer and energy level of LUMO in the light emission layer and d (eV) represents a difference between energy level of HOMO in the hole blocking layer and energy level of HOMO in the light emission layer.

In the organic EL element having the energy band structure described above, the hole blocking function of the element is sufficiently performed, which contributes to improvement of emission efficiency. However, even if the energy band structure is proper, when hole transporting function of a hole transporting material in the hole transporting layer is poor, it cannot contribute to improvement of emission efficiency. The present inventors have made an extensive study, and as a result, they have found that improvement of emission efficiency is realized by limiting the N/C ratio of the hole transporting material to a specific range, and completed the invention.

In the organic EL element of the invention, it is preferred that relationship $0.0 < c/d \leq 0.4$ is further satisfied. Hole blocking function of the organic EL element is further enhanced by limiting the c/d to the range as described above.

The organic EL element of the invention comprises a hole transporting layer, a light emission layer containing a host compound and a phosphorescent compound, a hole blocking layer and an electron transporting layer, and is characterized in that the relationship a>b is satisfied, wherein a (eV) represents a difference between energy level of LUMO in the light emission layer and energy level of LUMO in the hole transporting layer and b (eV) represents a difference between energy level of HOMO in the light emission layer and energy level of HOMO in the hole transporting layer.

Herein, "a" and "b" are represented by the following formulae:

a=(energy level of LUMO in the light emission layer)
−(energy level of LUMO in the hole transporting layer)

b=(energy level of HOMO in the light emission layer)
−(energy level of HOMO in the hole transporting layer)

It is preferred that relationship $a \geq b + 0.2$ is satisfied. In the organic EL element having such an energy band structure, the hole transporting layer of the element can sufficiently perform an electron blocking function.

In the invention, the light emission layer comprises a host compound and a phosphorescent compound (light emission material). Examples of the host compound include an aligoarylene derivative, a boron-containing compound, a styryl type compound, a triarylamine derivative, quinazoline or its derivatives, carbazole or its derivatives and triazine or its derivatives. Of these, a boron-containing compound, and carbazole or its derivatives are preferred. The phosphorescent compound in the invention is preferably a metal complex compound containing, as a center metal, a metal belonging to a group VIII of the periodic table, more preferably a metal complex compound containing osmium, iridium or platinum, and most preferably an iridium complex.

Examples of the phosphorescent compound in the invention will be listed below, but are not limited thereto.

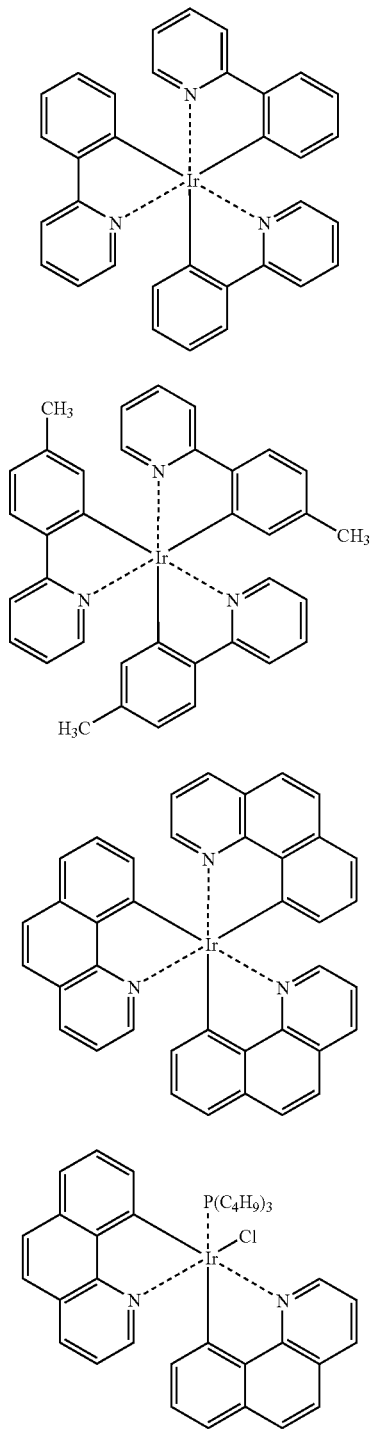

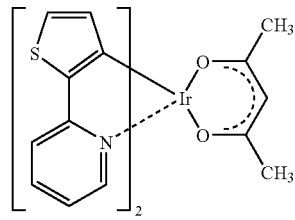

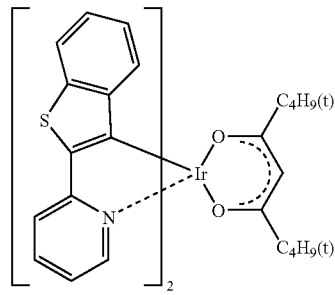

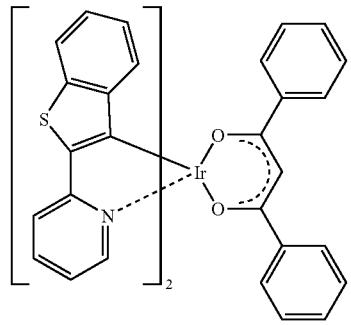

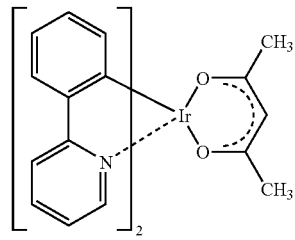

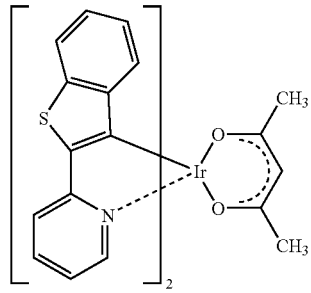

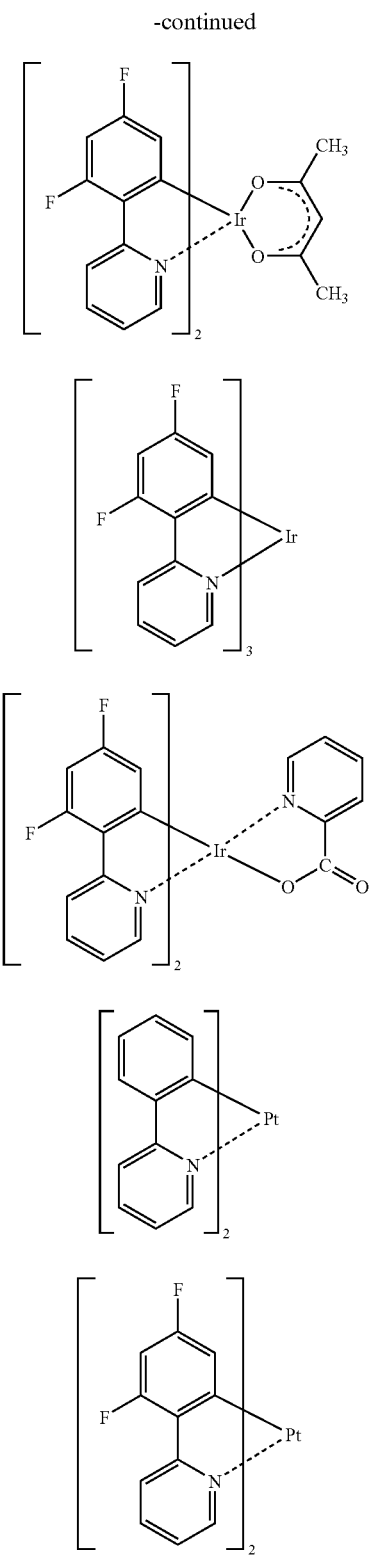
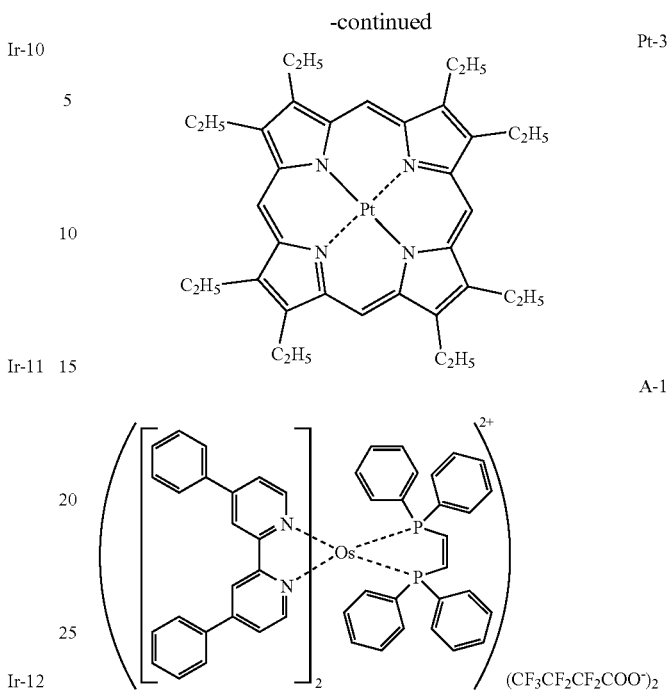

The doping amount of the phosphorescent compound in the invention is from more than 0% to less than 30% by weight, preferably from 0.1% to 20% by weight, and more preferably from 6% to less than 15% by weight, based on the host compound.

When a material in each layer of an organic EL element is employed so that the energy band structure defined in the invention is formed, the effect described in the invention is sufficiently exhibited, even if the phosphorescent compound is doped at the low doping amount as less than 6% by weight.

Constitution of the organic electroluminescence element of the invention will be detailed below.

The organic EL element in the invention comprises a hole transporting layer, a light emission layer a hole blocking layer, an electron transporting layer, and optionally an anode buffer layer and a cathode buffer layer, which are provided between a cathode and an anode.

In the invention, the preferred structure of the organic EL element is shown below, but the invention is not limited thereto.

(i) Anode/Hole transporting layer/Light emission layer/Hole blocking layer/Electron transporting layer/Cathode (ii) Anode/Anode buffer layer/Hole transporting layer/Light emission layer/Hole blocking layer/Electron transporting layer/Cathode buffer layer/Cathode The above light emission layer is a layer where electrons and holes, injected from electrodes, an electron transporting layer or a hole transporting layer, are recombined to emit light. The portions where light emits may be portions in the light emission layer or portions at the interface between the light emission layer and the layer adjacent thereto. The light emission materials (for example, phosphorescent compounds) of the light emission layer may have a hole transporting capability or an electron transporting capability as well as a light emission capability. Most of hole transporting materials used in the hole transporting layer, hole blocking materials used in the hole blocking layer, and electron transporting materials used in the electron transporting layer, can be used as light emission materials.

The light emission layer can be formed employing a known method such as a vacuum deposition method, a spin coat method, a casting method and a Langumiur-Blodgett method (LB method). The thickness of the light emission layer is not specifically limited, but is ordinarily from 5 nm to 5 μm. The light emission layer may be composed of a single layer comprising one or two or more of light emission materials, or of plural layers comprising the same composition or different composition.

The light emission layer can be formed by the method such as that described in Japanese Patent O.P.I. Publication No. 57-51781, in which a light emission material is dissolved in a solvent together with a binder such as a resin, and the thus obtained solution is formed into a thin layer by a method such as a spin-coat method. Thickness of the emission layer thus formed is not specially restricted. Although the thickness of the layer thus formed is optionally selected, the thickness is preferably within the range of from 5 nm to 5 μm.

The hole transporting layer, hole blocking layer, and electron transporting layer will be explained below.

The hole transporting layer has a function of transporting the hole injected from the anode to the light emission layer. Many holes can be injected in a lower electric field by the presence of the hole transporting layer between the anode and the light emission layer. Moreover, an element can be obtained which increases a light emission efficiency and has an excellent light emission ability, since the electrons injected into the light emission layer from the cathode buffer layer or the electron transporting layer are accumulated at the interface in the light emission layer by a barrier to electrons existing at the interface between the light emission layer and the hole transporting layer. The hole transporting material used in the hole transporting layer can be optionally selected from known materials without any limitation as far as they have the property defined in the invention. Such a material include those employed for hole injecting or transporting materials in conventional photoconductive elements or known materials used in the hole transporting layer of conventional organic EL elements.

The hole transporting material described above may be either an organic substance or an inorganic substance as long as it has a hole transporting ability or an ability to form a barrier to electron. Examples of the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole transporting material, those described above are used, but a porphyrin compound, an aromatic tertiary amine compound, or a styrylamine compound is preferably used, and an aromatic tertiary amine compound is more preferably used. A polymer can be used which contains the above materials in the side chain or in the main chain.

As the hole transporting material, inorganic compounds such as p-Si and p-SiC are usable. The hole transporting layer can be formed by layering the hole transporting material by a known method such as a vacuum deposition method, a spin coat method, a casting method and an LB method. The thickness of the hole transporting layer is not specifically limited, but is ordinarily from 5 nm to 5 μm. The hole transporting layer may be composed of a single layer comprising one or two or more of the materials mentioned above, or of plural layers comprising the same composition or different composition.

The hole blocking layer has a function inhibiting migration of holes injected from the anode. Probability of recombination of holes and electrons is increased by the presence of the hole transporting layer between the electron transporting layer and the light emission layer, which provides an element with an excellent light emission ability increasing a light emission efficiency. Examples of hole blocking materials used in the hole blocking layer include phenanthroline or its derivatives, triazole or its derivatives, aluminum complex (BAlq) with 5 ligands, an aligoarylene derivative, a styryl type compound, quinazoline or its derivatives, oxadiazole or its derivatives, pyrimidine or its derivatives, triazine or its derivatives, and a boron-containing compound. Of these, phenanthroline or its derivatives, an aligoarylene derivative, a styryl type compound, quinazoline or its derivatives, and a boron-containing compound are preferred.

The electron transporting layer has a function of transporting electrons injected to the cathode to the light emission layer. Many electrons are injected into the light emission layer at a lower electric field by the presence of the electron transporting layer between the cathode and the light emission layer. Examples of the electron transporting material used in the electron transporting layer include a nitro-substituted fluorene derivative, a diphenylquinone derivative, a thiopyran dioxide derivative, a heterocyclic tetracarboxylic acid anhydride such as naphthaleneperylene, a carbodiimide, a fluolenylidenemethane derivative, an anthraquinodimethane an anthrone derivative, an oxadiazole derivative, a triazole derivative and a phenanthroline derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material. A polymer can be used which contains the above materials in the side chain or in the main chain.

A metal complex of an 8-quinolynol derivative such as aluminum tris-(8-quinolynol) ($Alq_3$), aluminum tris-(5,7-dichloro-8-quinolynol), aluminum tris-(5,7-dibromo-8-quinolynol), aluminum tris-(2-methyl-8-quinolynol), aluminum tris-(5-methyl-8-quinolynol), or zinc bis-(8-quinolynol) ($znq_2$), and a metal complex formed by replacing the central metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for the light emission layer may preferably be employed as the electron transporting material. An inorganic semiconductor such as n-Si and n-SiC may also be used as the electron transporting material in a similar way as in the hole transporting layer.

An electron transporting layer can be formed by layering the compounds described above by a known method such as a vacuum deposition method, a spin coat method, a casting method and an LB method. The thickness of the electron transporting layer is not specifically limited, but is ordinarily from 5 nm to 5 μm. The electron transporting layer may be composed of a single layer comprising one or two or more of the materials mentioned above, or of plural layers comprising the same composition or different composition.

A buffer layer (an electrode interface layer) may be provided between the anode and the hole transporting layer, or between the cathode and the electron transporting layer.

The buffer layer is a layer provided between the electrode and an organic layer in order to reduce the driving voltage or to improve light emission efficiency. As the buffer layer there are an anode buffer layer and a cathode buffer layer, which are described in "Electrode Material" page 123, Div. 2 Chapter 2 of "Organic EL element and its frontier of industrialization" (published by NTS Corporation, Nov. 30, 1998) in detail.

The anode buffer layer is described in Japanese Patent O.P.I. Publication Nos. 9-45479, 9-260062;and 8-288069 etc., and its examples include a phthalocyanine buffer layer represented by a copper phthalocyanine layer, an oxide buffer layer represented by a vanadium oxide layer, an amorphous carbon buffer layer, a polymer buffer layer employing an electroconductive polymer such as polyaniline (emeraldine), and polythiophene, etc.

The cathode buffer layer is described in Japanese Patent O.P.I. Publication Nos. 6-325871, 9-17574, and 9-74586, etc. in detail, and its examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide or lithium oxide layer.

In the organic EL element of the invention, presence of the cathode buffer layer is preferable in reducing the driving voltage or improving light emission efficiency.

The buffer layer is preferably very thin and has a thickness of preferably from 0.1 to 100 nm depending on kinds of the material used.

Electrodes of the organic EL element will be explained below. The electrodes consist of a cathode and an anode.

For the anode of the organic EL element, a metal, an alloy, or an electroconductive compound each having a high working function (not less than 4 eV), and mixture thereof are preferably used as the electrode material. Concrete examples of such an electrode material include a metal such as Au, and a transparent electroconductive material such as CuI, indium tin oxide (ITO), $SnO_2$, or ZnO.

The anode may be prepared by forming a thin layer of the electrode material according to a depositing or sputtering method, and by forming the layer into a desired pattern according to a photolithographic method. When required precision of the pattern is not so high (not less than 100 μm), the pattern may be formed by evaporating or sputtering of the electrode material through a mask having a desired form. When light is emitted through the anode, the transmittance of the anode is preferably 10% or more, and the sheet resistivity of the anode is preferably not more than several hundred Ω/□. The thickness of the anode is ordinarily within the range of from 10 nm to 1 μm, and preferably from 10 to 200 nm, although it may vary due to kinds of materials used.

On the other hand, for the cathode, a metal (also referred to as an electron injecting metal), an alloy, and an electroconductive compound each having a low working function (not more than 4 eV), and a mixture thereof is used as the electrode material. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them, a mixture of an electron injecting metal and a metal higher in the working function than that of the electron injecting metal, such as the magnesium/silver mixture, magnesium/aluminum mixture, magnesium/indium mixture, aluminum/aluminum oxide ($Al_2O_3$) mixture or lithium/aluminum mixture, is suitable from the view point of the electron injecting ability and resistance to oxidation.

For materials for the cathode used in the organic EL element of the invention, an aluminum alloy is preferably used, and the aluminum alloy contains aluminum in an amount of preferably from 90% to less than 100% by weight, and more preferably from 95% to less than 100% by weight. This can provide an organic EL element with high luminance and long emission lifetime.

The cathode can be prepared forming a thin layer of such an electrode material by a method such as a deposition or sputtering method. The sheet resistivity of the cathode is preferably not more than several hundred Ω/□, and the thickness of the cathode is ordinarily from 10 nm to 1 μm, and preferably from 50 to 2,00 nm. It is preferable in increasing the light emission efficiency that either the anode or the cathode of the organic EL element is transparent or translucent.

A substrate preferably employed for the organic electroluminescence element of the invention is not restricted to specific kinds of materials such as glass and plastic, as far as it is transparent. Examples of the substrate preferably employed used in the organic electroluminescence element of the invention include glass, quartz and light transmissible plastic film.

Examples of the light transmissible plastic film include films such as polyethyleneterephthalate (PET), polyethylenenaphthalate (PEN), polyethersulfone (PES), polyetherimide, polyetheretherketone, polyphenylenesulfide, polyarylate, polycarbonate (PC), cellulose triacetate (TAC), cellulose acetate propionate (CAP) and so on.

Preferable examples in the preparation of the organic EL element will be described below.

For one example, preparation of the EL element having the foregoing constitution, Anode/Hole transporting layer/Light emission layer/Hole blocking layer/Electron transporting layer/Cathode buffer layer/Cathode will be described.

A thin layer of a desired material for electrode such as a material of the anode is formed on a suitable substrate by a deposition or sputtering method, so that the thickness of the layer is not more than 1 μm, and preferably within the range of from 10 to 200 nm to prepare the anode. Then, the hole transporting layer, the light emission layer, the hole blocking layer, the electron transporting layer and the cathode buffer layer are formed on the resulting anode in that order.

For methods for forming the layers described above, there are a spin coating method, a casting method and a deposition method. A vacuum deposition method or a spin coat method is preferable since a uniform layer can be formed and a pinhole is formed with difficulty. Different layer forming methods may be used on forming different layers. Although conditions of the vacuum deposition are different due to kinds of materials used, or an intended crystalline or association structure of the molecular deposited layer, the vacuum deposition is preferably carried out at a boat temperature of from 50° C. to 450° C., at a vacuum degree of from $10^{-6}$ to $10^{-3}$ Pa, at a deposition speed of from 0.01 to 50 nm/second, and at a substrate temperature of from −50 to 300° C., to form a layer thickness of from 5 nm to 5 μm.

After formation of these layers, a layer comprising a material for cathode is formed thereon by, for example, a deposition method or sputtering method so that the thickness is not more than 1 μm, and preferably from 50 to 200 nm, to provide the cathode. Thus a desired organic EL element is obtained. It is preferred that the layers from the hole injecting layer to the cathode are continuously formed under one time of vacuuming to prepare the organic EL element. However, on the way of the layer formation under vacuum a different layer formation method may be inserted. When the different layer formation method is used, the method is required to be carried out under a dry inert gas atmosphere.

Further, the organic EL element can be prepared in the reverse order, in which the cathode, the cathode buffer layer, electron transporting layer, the hole blocking layer, the light emission layer, the hole transporting layer, and the anode are formed in that order. Light emission can be observed when a direct current with a voltage of from about 5 to 40 V is applied to the thus prepared organic EL element so that the polarity of the anode is positive and that of the cathode is negative. When the voltage is applied in the reverse polarity, no current is formed and light is not emitted at all. When an alternating current is applied, light is emitted only when the polarity of the node is positive and that of the cathode is negative. The shape of the wave of the alternating current may be optionally selected.

The organic EL element of the invention may be used as a lamp such as a room light or a light source for exposure, a projection device projecting an image or a display directly viewing a still image or a moving image. When the element is used as a display for reproducing a moving image, the driving method may be either a simple matrix (passive matrix) method or an active matrix method. When two or more kinds of the organic EL element of the invention are used which have different emission light color, a full color display can be prepared.

EXAMPLES

The present invention will be explained in the following examples, but is not limited thereto.

Example 1

<Preparation of Organic EL Element>

(Preparation of Organic EL Element Sample OLED 1)

A pattern was formed on a substrate (manufactured by NH Technoglass Co., Ltd.) composed of a glass plate and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes. Thus obtained transparent substrate was fixed on a substrate holder of a vacuum deposition apparatus available in the market.

After the pressure in the vacuum tank was reduced to $4 \times 10^{-4}$ Pa, copper phthalocyanine was deposited on the ITO layer to give a hole injecting layer with a thickness of 10 nm, and then α-NPD was deposited to give a hole transporting layer with a thickness of 30 nm. A heating boat carrying CBP and a heating boat carrying exemplified compound Ir-10 were independently heated by supplying an electric current to both boats to deposit CBP and Ir-10 onto the hole transporting layer at a depositing speed ratio of CBP to Ir-10 of 100:6 to form a light emission layer with a thickness of 30 nm.

A heating boat carrying BC was heated by supplying an electric current to form a hole blocking layer with a thickness of 10 nm, and a heating boat carrying $Alq_3$ was heated by supplying an electric current to form thereon an electron transporting with a thickness of 20 nm. Further, 1 nm lithium fluoride layer was deposited on the electron transporting layer and a 100 nm aluminum layer was provided on the lithium fluoride layer. Thus, organic EL element sample OLED 1 (comparative) was prepared. This element sample emitted blue light resulting from Ir-10.

(Preparation of Organic EL Element Samples OLED 2 Through 18)

Organic EL element samples OLED 2 through 18 were prepared in the same manner as comparative organic EL element sample OLED 1;except that compound α-NPD in the hole transporting layer, host compound CBP in the light emission layer or compound BC in the hole blocking layer was replaced with those as shown in Table 1.

(Measurement of Characteristic Value of Each Compound)

<Measurement of Band Gap of the Host Compound>

Each host compound used in the above organic EL element samples OLED 1 through 18 is deposited on a glass substrate to form a 100 nm deposit layer, and absorption spectra of the resulting deposit layer are measured. Band gap X (eV) is determined a band gap X (eV) from a wavelength Y (nm) at the longer absorption edge in the absorption spectra employing the following formula:

$$X = 1239.8/Y$$

The results are shown in Table 1

<Energy Level (eV) of LUMO of Each Compound and Energy Level (eV) of HOMO (Highest Occupied Molecular Orbital of Each Compound>

Energy level (eV) of LUMO and energy level (eV) of HOMO (highest occupied molecular orbital of each compound used in the above organic EL element samples OLED 1 through 18 are shown in Table 2.

TABLE 1

| Sample No. | Hole transporting layer Compound | N/C | Host compound in the light emission layer Compound | Band gap (eV) | *MW | Material in the hole blocking layer | Energy level difference (eV) a | b | c | d | c/d | Remarks |
|---|---|---|---|---|---|---|---|---|---|---|---|---|
| 1 | α-NPD | 0.045 | CBP | 3.1 | 484 | BC | 0.6 | 0.6 | 0.0 | 0.4 | 0.0 | Comp. |
| 2 | α-NPD | 0.045 | BC | 3.5 | 360 | BC | 0.6 | 1.0 | 0.0 | 0.0 | — | Comp. |
| 3 | α-NPD | 0.045 | TAZ | 4.0 | 347 | BC | 0.1 | 1.0 | 0.5 | 0.0 | — | Comp. |
| 4 | α-NPD | 0.045 | TCTA | 3.2 | 741 | BC | 0.4 | 0.5 | 0.2 | 0.5 | 0.4 | Comp. |
| 5 | HMTPD | 0.048 | CBP | 3.1 | 484 | BC | 0.8 | 0.6 | 0.0 | 0.4 | 0.0 | Comp. |
| 6 | HMTPD | 0.048 | TAZ | 4.0 | 347 | BC | 0.3 | 1.0 | 0.5 | 0.0 | — | Comp. |

TABLE 1-continued

| Sample No. | Hole transporting layer Compound | N/C | Host compound in the light emission layer Compound | Band gap (eV) | *MW | Material in the hole blocking layer | Energy level difference (eV) a | b | c | d | c/d | Remarks |
|---|---|---|---|---|---|---|---|---|---|---|---|---|
| 7  | m-MTDATXA | 0.063 | Compound 2 | 3.4 | 1095 | Compound 6 | 0.4 | 0.6 | −0.1 | 0.5 | −0.2 | Inv. |
| 8  | TPD2      | 0.045 | Compound 2 | 3.4 | 1095 | BC         | 0.5 | 0.3 |  0.3 | 0.4 |  0.75 | Inv. |
| 9  | m-MTDATXA | 0.063 | Compound 2 | 3.4 | 1095 | Compound 1 | 0.4 | 0.6 |  0.0 | 0.4 |  0.0  | Inv. |
| 10 | m-MTDATXA | 0.063 | Compound 2 | 3.4 | 1095 | Compound 3 | 0.4 | 0.6 | −0.1 | 0.1 | −1.0  | Inv. |
| 11 | m-MTDATXA | 0.063 | Compound 2 | 3.4 | 1095 | BC         | 0.4 | 0.6 |  0.3 | 0.4 |  0.75 | Inv. |
| 12 | m-MTDATXA | 0.063 | Compound 4 | 3.2 | 858  | BC         | 0.3 | 0.1 |  0.4 | 0.7 |  0.57 | Inv. |
| 13 | TPD1      | 0.050 | Compound 4 | 3.2 | 858  | BC         | 0.2 | 0.1 |  0.4 | 0.7 |  0.57 | Inv. |
| 14 | m-MTDATXA | 0.063 | TCTA       | 3.2 | 741  | BC         | 0.5 | 0.5 |  0.2 | 0.5 |  0.4  | Inv. |
| 15 | TPD1      | 0.050 | TCTA       | 3.2 | 741  | BC         | 0.4 | 0.3 |  0.2 | 0.5 |  0.4  | Inv. |
| 16 | m-MTDATXA | 0.063 | CBP        | 3.1 | 484  | BC         | 0.7 | 0.6 |  0.0 | 0.4 |  0.0  | Inv. |
| 17 | TPD1      | 0.050 | CBP        | 3.1 | 484  | BC         | 0.6 | 0.4 |  0.0 | 0.4 |  0.0  | Inv. |
| 18 | TPD1      | 0.050 | CBP        | 3.1 | 484  | Compound 5 | 0.6 | 0.4 | −0.3 | 0.5 | −0.6  | Inv. |

*MW: molecular weight, Comp.: Comparative, Inv.: Inventive

TABLE 2

| Compound | Energy level (eV) HOMO | LUMO |
|---|---|---|
| α-NPD      | 5.4 | 2.3 |
| HMTPD      | 5.4 | 2.1 |
| m-MTDATXA  | 5.4 | 2.2 |
| TPD1       | 5.6 | 2.3 |
| TPD2       | 5.7 | 2.1 |
| CBP        | 6.0 | 2.9 |
| BC         | 6.4 | 2.9 |
| TAZ        | 6.4 | 2.4 |
| TCTA       | 5.9 | 2.7 |
| Compound 1 | 6.4 | 2.6 |
| Compound 2 | 6.0 | 2.6 |
| Compound 3 | 6.1 | 2.5 |
| Compound 4 | 5.7 | 2.5 |
| Compound 5 | 6.5 | 2.6 |
| Compound 6 | 6.5 | 2.5 |
| Alq$_3$    | 5.8 | 3.1 |

In Table 1, N/C represents a nitrogen atom number in the hole transporting material/a carbon atom number in the hole transporting material, "a" represents (a LUMO energy level (eV) in the light emission layer—a LUMO energy level (eV) in the hole transporting layer), "b" represents (a HOMO energy level (eV) in the light emission layer—a HOMO energy level (eV) in the hole transporting layer), "c" represents (a LUMO energy level (eV) in the hole blocking layer—a LUMO energy level (eV) in the light emission layer), and "d" represents (a HOMO energy level (eV) in the hole blocking layer—a HOMO energy level (eV) in the light emission layer).

The chemical structures of the compounds used above are shown below.

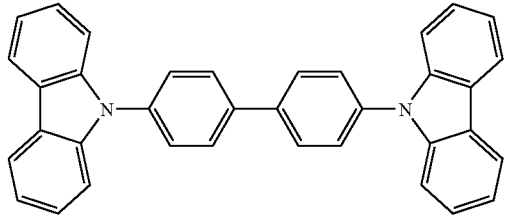
CBP

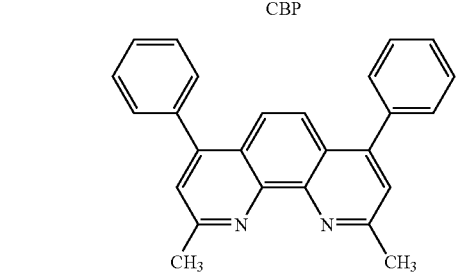
BC

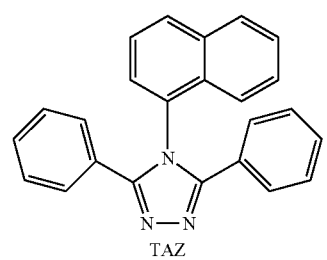
TAZ

-continued
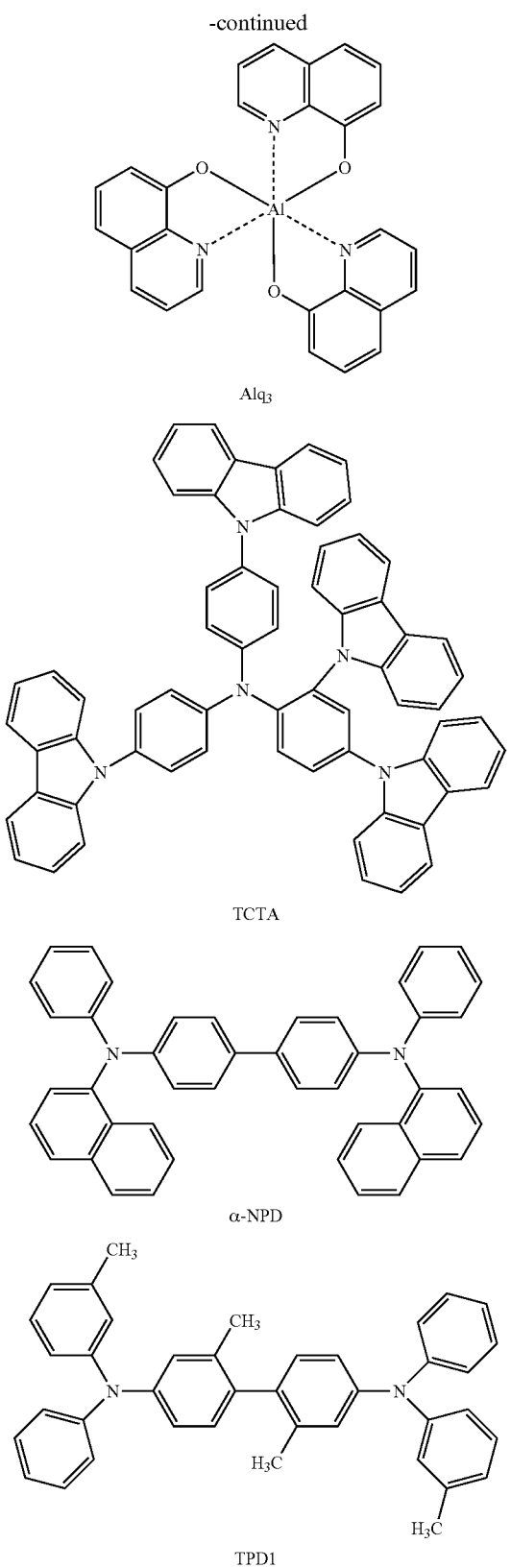
Alq3
TCTA
α-NPD
TPD1
-continued
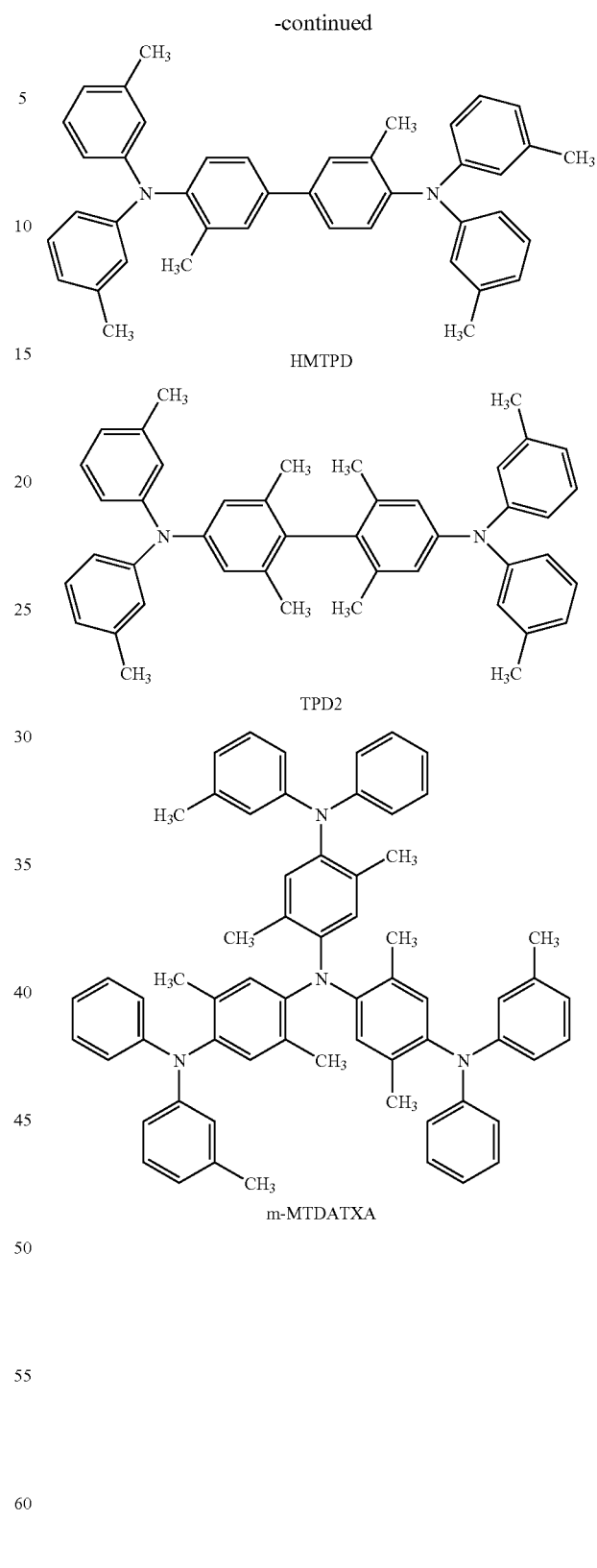
HMTPD
TPD2
m-MTDATXA -continued Compound 1

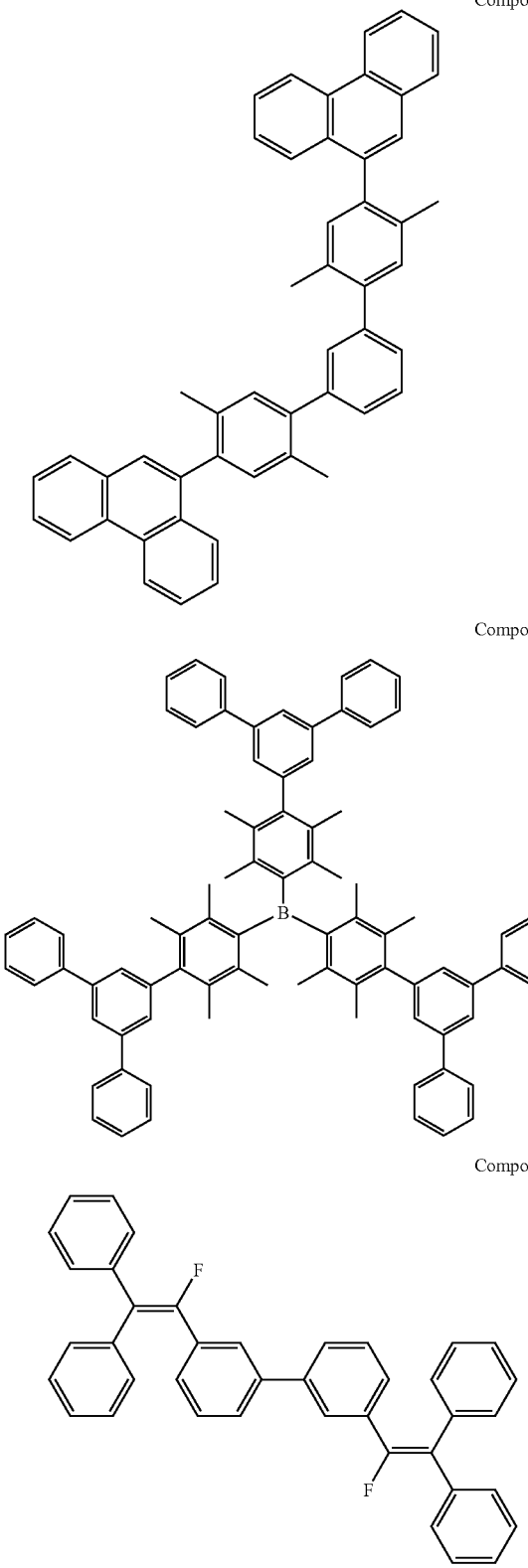

Compound 2

Compound 3

Compound 4

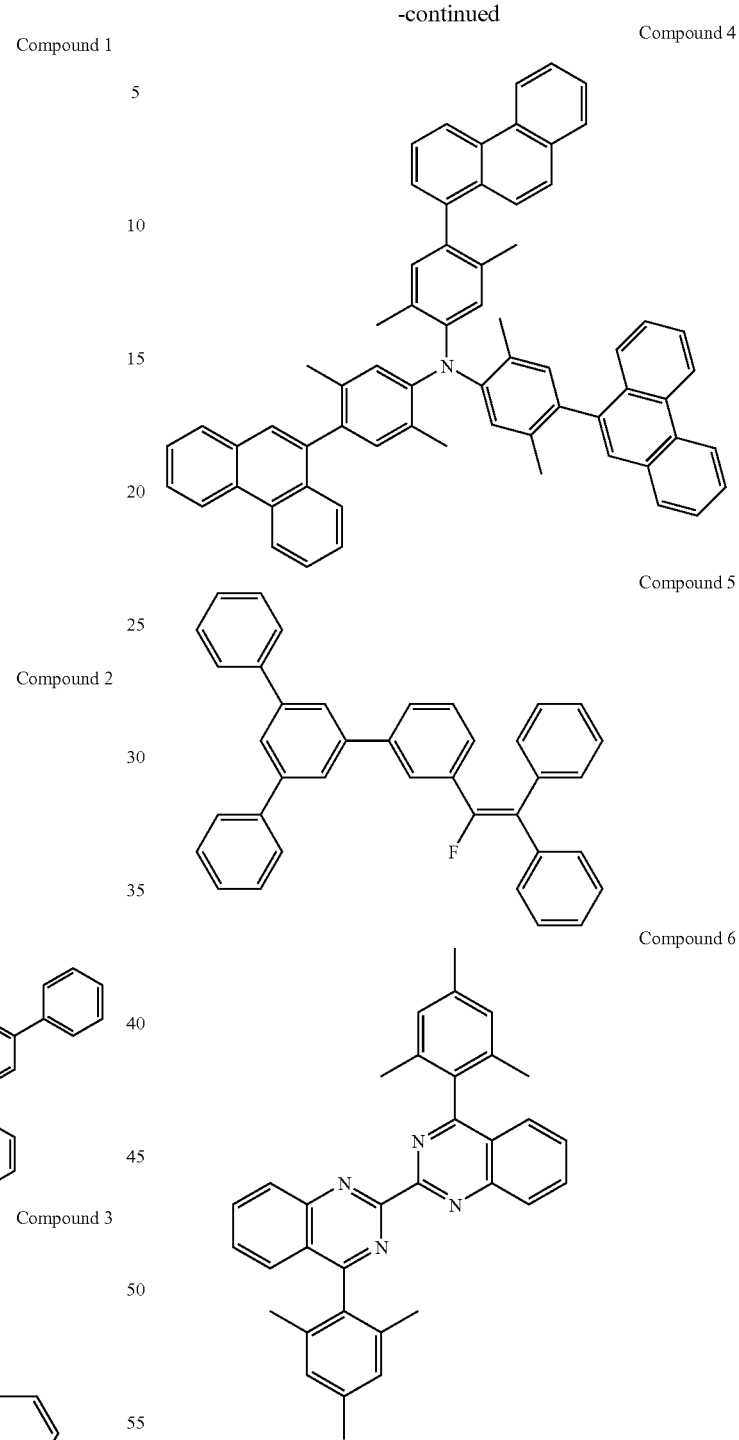

Compound 5

Compound 6

<<Evaluation of Characteristics of Organic EL Element Samples>>

When a direct current voltage of 10V was applied to each of the resulting organic EL element samples at 23° C. in an atmosphere of a dried nitrogen gas, luminance (cd/m²) of light emitted from the sample and time (hereinafter referred to also as luminance half-life) taken until the luminance was reduced to half were measured. The luminance of light emitted from the organic EL element sample Nos. 2 through 18 was expressed by a relative value (hereinafter referred to also as relative luminance) when the luminance of light emitted from the organic EL element sample No. 1 was set at 100. The luminance half-life of light emitted from the organic EL element sample Nos. 2 through 18 was expressed by a relative value (hereinafter referred to also as relative luminance half-life) when the luminance half-life of light emitted from the organic EL element sample No. 1 was set at 100. The luminance (cd/m$^2$) was measured according to CS-1000 produced Minolta Co., Ltd. The results are shown in Table 3.

TABLE 3

| Sample No. | Evaluation results | | Remarks |
|---|---|---|---|
| | Relative luminance | Relative luminance half-life | |
| 1 | 100 | 100 | Comparative |
| 2 | 105 | 80 | Comparative |
| 3 | 105 | 83 | Comparative |
| 4 | 110 | 107 | Comparative |
| 5 | 112 | 100 | Comparative |
| 6 | 110 | 95 | Comparative |
| 7 | 148 | 172 | Invention |
| 8 | 145 | 153 | Invention |
| 9 | 149 | 190 | Invention |
| 10 | 155 | 170 | Invention |
| 11 | 149 | 173 | Invention |
| 12 | 141 | 148 | Invention |
| 13 | 144 | 145 | Invention |
| 14 | 158 | 195 | Invention |
| 15 | 160 | 194 | Invention |
| 16 | 150 | 162 | Invention |
| 17 | 163 | 170 | Invention |
| 18 | 165 | 173 | Invention |

As is apparent from Table 1 and 3 above, inventive organic electroluminescence element samples comprising the hole transporting material in the invention, the light emission material in the invention, and the hole blocking material in the invention exhibited an excellent result in luminance and emission lifetime, compared with comparative samples.

Example 2

Organic EL element samples OLED 7G through OLED 18G were prepared in the same manner as in organic EL element samples OLED 7 through OLED 18 of Example 1, respectively, except that Ir-1 was used instead of Ir-10. Further, organic EL element samples OLED 7R through OLED 18R were prepared in the same manner as in organic EL element samples OLED 7 through OLED 18 of Example 1, respectively, except that Ir-9 was used instead of Ir-10. The resulting samples were evaluated for luminance and luminance half-life in the same manner as in Example 1. As a result, inventive organic electroluminescence element samples exhibited an excellent result in luminance and emission lifetime. Green light was emitted from the samples employing Ir-1, and red light was emitted from the samples employing Ir-9.

EFFECT OF THE INVENTION

The present invention can provide an organic electroluminescence element with excellent luminance and with long lifetime.

What is claimed is:

1. An organic electroluminescence element comprising a hole transporting layer containing a hole transporting material, a light emission layer containing a host compound and a phosphorescent compound, a hole blocking layer, and an electron transporting layer, the light emission layer being in physical contact with the hole transporting layer, the hole transporting material having a ratio N/C of a nitrogen atom number N to a carbon atom number C of from 0.05 to 0.10, and relationship c<d being satisfied, wherein c (eV) represents a difference between energy level of LUMO (lowest unoccupied molecular orbital) in the hole blocking layer and energy level of LUMO in the light emission layer and d (eV) represents a difference between energy level of HOMO (highest occupied molecular orbital) in the hole blocking layer and energy level of HOMO in the light emission layer, and relationship a≧b+0.2 being satisfied, wherein a (eV) represents a difference between energy level of LUMO in the light emission layer and energy level of LUMO in the hole transporting layer and b (eV) represents a difference between energy level of HOMO in the light emission layer and energy level of HOMO in the hole transporting layer.

2. The organic electroluminescence element of claim 1, wherein relationship 0.0<c/d≦0.4 is satisfied.

3. The organic electroluminescence element of claim 1, wherein the phosphorescent compound is an iridium complex, an osmium complex or a platinum complex.

4. The organic electroluminescence element of claim 3, wherein the phosphorescent compound is an iridium complex.

5. The organic electroluminescence element of claim 3, wherein the phosphorescent compound is an osmium complex or a platinum complex.

* * * * *